United States Patent
Wang et al.

(10) Patent No.: US 10,228,417 B2
(45) Date of Patent: Mar. 12, 2019

(54) TEST FIXTURE AND TEST DEVICE FOR IC

(71) Applicant: Shenzhen Sireda Technology Co., Ltd, Shenzhen, Guangdong (CN)

(72) Inventors: Guohua Wang, Guangdong (CN); Wei Xie, Guangdong (CN)

(73) Assignee: Shenzhen Sireda Technology Co., Ltd, Shenzhen (CN)

( * ) Notice: Subject to any disclaimer, the term of this patent is extended or adjusted under 35 U.S.C. 154(b) by 148 days.

(21) Appl. No.: 15/190,166

(22) Filed: Jun. 22, 2016

(65) Prior Publication Data

US 2017/0131347 A1    May 11, 2017

(30) Foreign Application Priority Data

Nov. 5, 2015    (CN) .................... 2015 2 0878808 U

(51) Int. Cl.
    *G01R 31/28*    (2006.01)
    *G01R 1/04*    (2006.01)

(52) U.S. Cl.
    CPC ....... *G01R 31/2886* (2013.01); *G01R 1/0441* (2013.01); *G01R 1/0466* (2013.01)

(58) Field of Classification Search
    None
    See application file for complete search history.

(56) References Cited

U.S. PATENT DOCUMENTS

| | | | | |
|---|---|---|---|---|
| 4,846,704 A * | 7/1989 | Ikeya | ................ | G01R 31/2886 439/266 |
| 5,088,190 A * | 2/1992 | Malhi | .................. | G01R 1/0483 174/254 |
| 5,171,290 A * | 12/1992 | Olla | ..................... | G01R 1/0475 439/66 |
| 5,479,110 A * | 12/1995 | Crane | ................. | G01R 1/0433 324/754.07 |
| 6,429,644 B1 * | 8/2002 | McAllister | .......... | G01R 1/0416 324/750.25 |
| 6,914,445 B2 * | 7/2005 | Fan | ...................... | G01R 1/0466 324/756.02 |
| 7,583,097 B2 * | 9/2009 | Barabi | ................ | G01R 1/0483 324/756.01 |

* cited by examiner

*Primary Examiner* — Paresh H Patel

(57) ABSTRACT

An IC test device includes a test circuit board and a test fixture. The fixture includes an interposer, a test socket, and a fastener. A protrusion is formed at a bottom face of the interposer, and a space is formed besides the protrusion. A plurality of first contacts is formed at the bottom of the protrusion for soldering with corresponding pads of the test circuit board. A plurality of second contacts is formed on a top face of the interposer and electrically connected to the first contacts. The socket defines a guide groove for receiving an IC. A plurality of conductors are arranged corresponding to the guide groove and extend through the test socket. Each conductor has a bottom end electrically connected to one corresponding second contact and a top end for contacting a pin of the IC. The fastener is mounted on the test socket to press the IC.

11 Claims, 15 Drawing Sheets

TEST FIXTURE AND TEST DEVICE FOR IC

CROSS REFERENCE TO RELATED APPLICATIONS

This non-provisional patent application claims priority under 35 U.S.C. § 119(a) from Chinese Utility Model Application No. 201520878808.X filed on Nov. 5, 2015.

FIELD OF THE INVENTION

This invention relates to testing field of semiconductors, and in particular, to an IC (Integrated Circuit) test fixture and an IC test device adopting the IC test fixture.

BACKGROUND OF THE INVENTION

A method in the art for testing electric property of an IC needs different test fixtures for different kinds of test boards, which not only makes long term for making fixtures, but also high cost. In addition, conductors contact the pads of the test board directly, and thus puncturing of the pads usually generated, further increasing the cost.

Another method is making a demo board and fixing a test socket on the demo board supporting the IC to be tested. Conductors in the test socket electrically contact the pads of the demo board, which makes the test is stable. However, layers for such demo board are multiple, which is not only difficult in design and produce, but also high in cost.

SUMMARY OF THE INVENTION

Accordingly, the present invention provides an IC test fixture and an IC test device adopting such a fixture which can shorten the time and reduce the cost for producing the test device, and improve reliability of the test.

According to one aspect, the present invention provide an IC test fixture that includes an interposer, a test socket, and a fastener. The interposer includes a bottom face and an opposite top face. A protrusion is formed at the bottom face of the interposer, and a space is formed besides the protrusion. A plurality of first contacts is formed at the bottom of the protrusion for soldering with corresponding pads of a test circuit board to solder the interposer onto the test circuit board. A plurality of second contacts is formed on the top face of the interposer and electrically connected to the first contacts, respectively. The test socket defines a guide groove in a middle of a top thereof for receiving an IC to be tested. A plurality of conductors are arranged at a position corresponding to the guide groove and extending through the test socket. A bottom end of each conductor is electrically connected to one corresponding second contact on the top face of the interposer, and a top end of each conductor is for contacting a pin of the IC to be tested when the test socket is mounted on the interposer. The fastener is mounted on the test socket to press the IC to be tested.

Further, the space is at opposite sides of the protrusion or surrounds the protrusion.

Further, the space is two in number and at opposite sides of the protrusion, and the interposer forms two mounting portions corresponding to the two spaces, each mounting portion defining at least one first mounting hole, the test socket defining a second mounting hole corresponding to each first mounting hole, locking members cooperating with corresponding first and second mounting holes to fix the interposer and test socket together.

Further, the locking members are screws, the first mounting holes are screw holes, and the second mounting holes are through holes, the screws extending upwards through the second mounting holes and then screwed in the first mounting holes to fix the interposer and test socket together.

Further, a plurality of conducting poles are arranged in the interposer corresponding to the pins of the IC to be tested, each first contact being electrically connected to the corresponding second contact via one conducting pole.

Further, the first contacts, second contacts, and conducting poles of the interposer are formed through printed circuit board manufacture.

Further, the interposer is formed by implanting conducting poles in an insulating board, the first contacts being formed at the bottom ends of the conducting poles, and the second contacts being formed at the top ends of the conducting poles.

Further, the conductors are probes or conductive adhesive, each conductor forming an electrode at a bottom thereof for electrically connecting one corresponding second contact and forming a plurality of bumps at a top thereof, the bumps evenly spaced from each other along a circumferential direction, a cutout being defined between each two neighboring bumps, the bumps of each conductor being electrically connected to one corresponding pin of the IC when the IC to be tested is mounted in the guide groove of the test socket.

Further, the test socket comprises a seat body and a connector fixed to the bottom of the seat body, a plurality of terminals being formed at the bottom of the connector, a plurality of third contacts being formed at the top of the connector and electrically connected to the terminals, respectively, the connector and interposer being mechanically and electrically connected through inserting connection of the corresponding terminals and second contacts.

Further, the second contacts of the interposer are poles connected to the top ends of the conducting poles, and the terminals of the connector define inserting holes corresponding to the poles.

Further, the interposer is formed by implanting conducting poles in an insulating board, the first contacts are formed at the bottom ends of the conducting poles, and the second contacts are elastic claws formed in the conducting poles.

Further, an arrangement of the second contacts on the top face of the interposer is the same as that of the pads of the test circuit board Further, an arrangement of the second contacts on the top face of the interposer is different from that of the pads of the test circuit board, and the second contacts are in two lines and adjacent to lateral sides of the interposer.

According to another aspect, the present invention further provides an IC test device that includes a test circuit board and above IC test fixture.

Compared to the art, the present IC test device includes an IC test fixture which forms the protrusion at the bottom face of the interposer and space besides the protrusion, thereby making the size of the protrusion can be designed generally the same with that of the IC to be tested. Thus, the space besides the protrusion avoids interference of the interposer with electrical elements around a mounting position of the test circuit board for the IC, which facilitates soldering the interposer onto the test circuit board and improves reliability of the test. Compared to related test fixture in the art, making test circuit board for each test fixture is not needed, greatly shorten the time and reducing the cost for producing the test device. In addition, the conductors are connected to the test circuit board indirectly, avoiding puncturing the pads of the test circuit board, and accordingly improving reliability of the test and lifespan of the test device.

Figure 1:
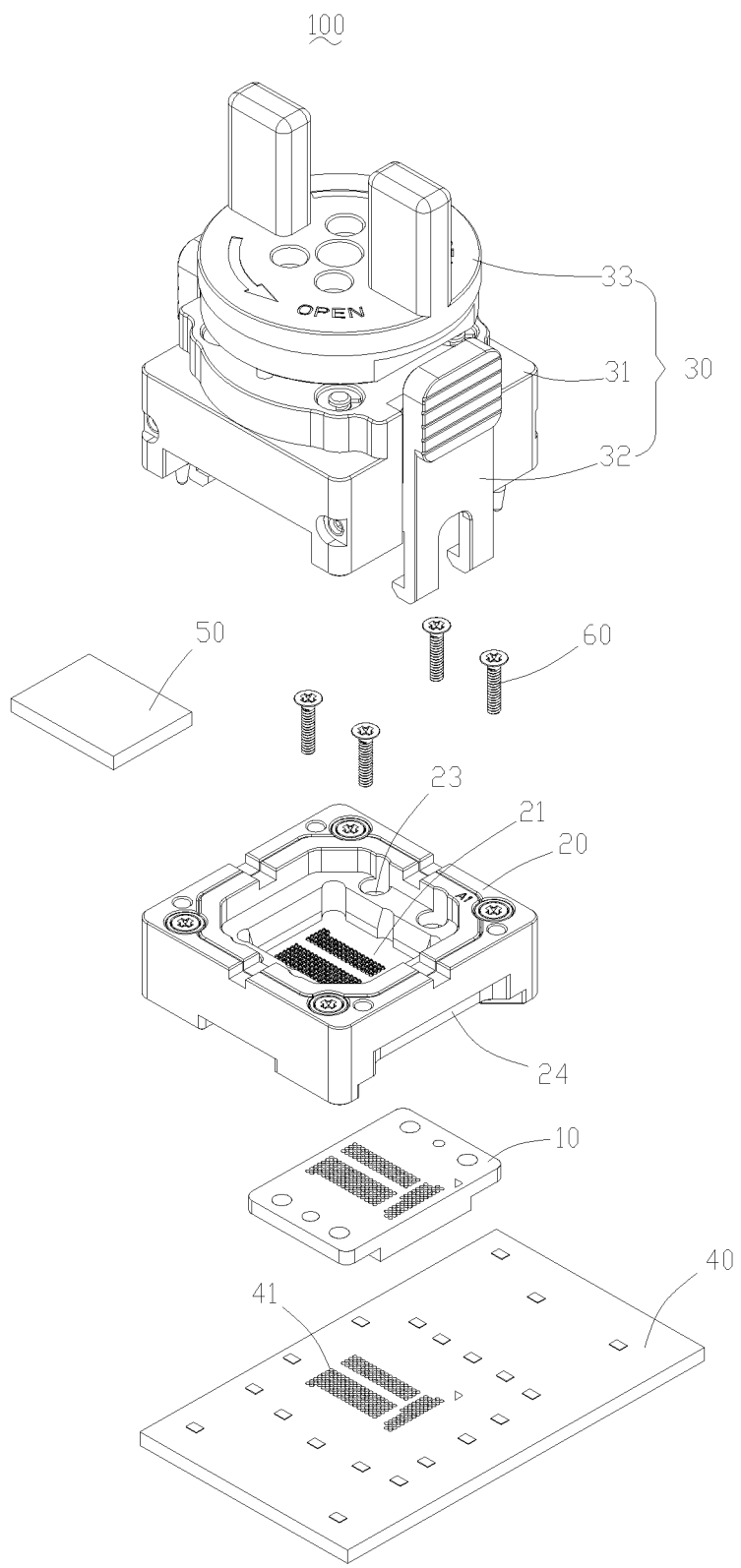
FIG. 1 is a schematic, exploded view of an IC test device according to a first embodiment of the present invention.

The present invention will now be more particularly described, by way of example only, with reference to the accompanying drawings. It should be understood that dimensions of components and features shown in the drawings are generally chosen for convenience and clarity of presentation and are not necessarily shown to scale.

DETAILED DESCRIPTION OF THE PREFERRED EMBODIMENTS

The present invention will be described with reference to one or more embodiments. It should be appreciated by those skilled in the art that various modifications are possible. Therefore, the scope of the invention is to be determined by reference to the claims.

Figure 2:
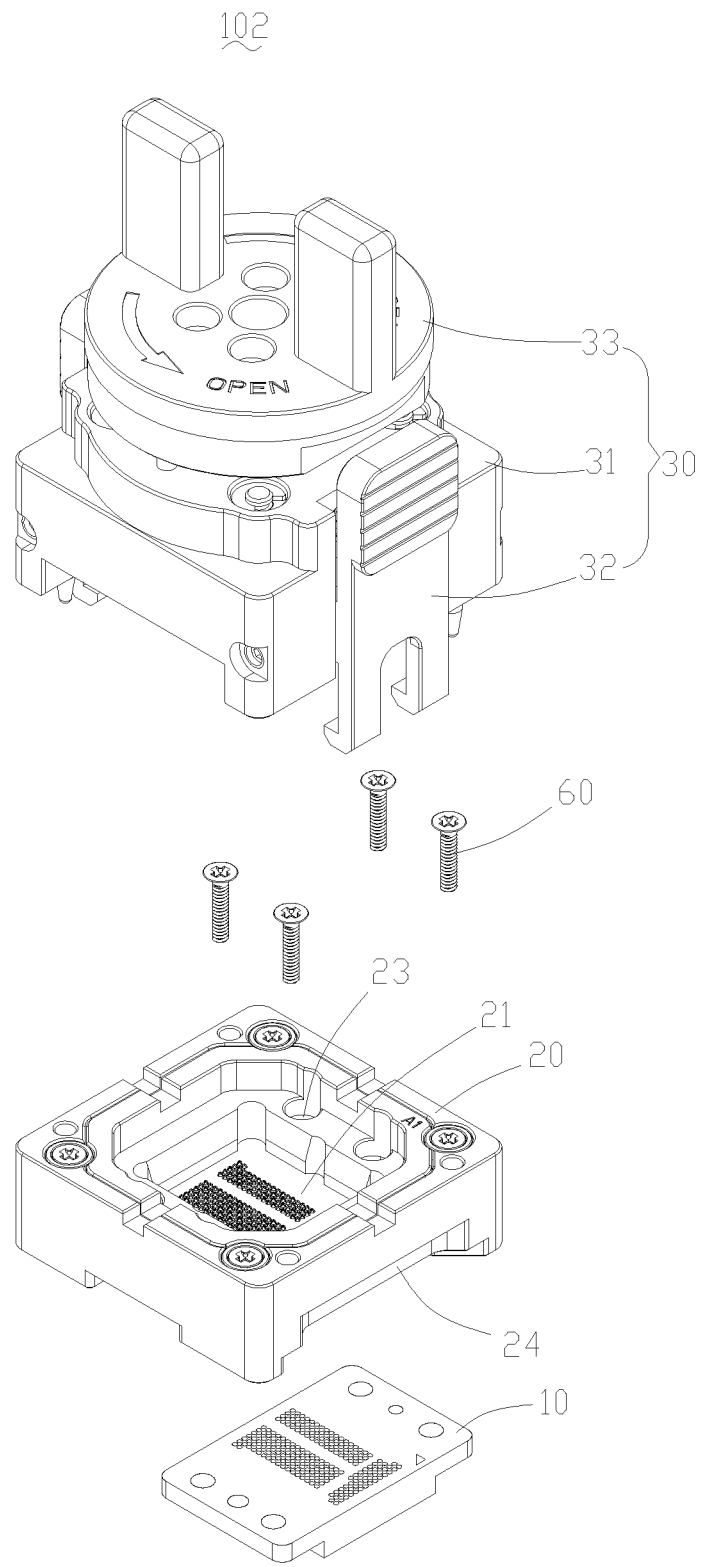
FIG. 2 is an exploded view of a test fixture of the test device of FIG. 1, with an IC to be tested.

The present invention provides an IC test device. As shown in FIGS. 1-7, in the first embodiment of the present invention, the IC test device 100 includes a test fixture 102 and a test circuit board 40. The test fixture 102 includes an interposer 10, a test socket 20, and a fastener 30 (as shown in FIG. 2). The test fixture 102 is mounted on the test circuit board 40 for supporting an IC to be tested 50 thereon, thereby interconnecting the IC 50 and the test circuit board 40 electrically, and thus testing electric property of the IC 50 through testing the test circuit board 40.

Figure 3:
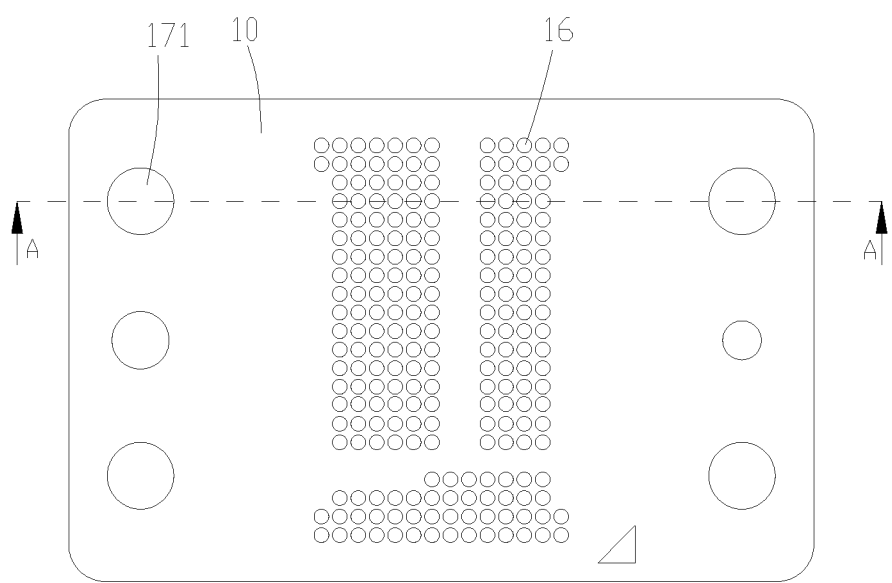
FIG. 3 is a top plan view of an interposer of the test fixture of FIG. 2.
Figure 4:
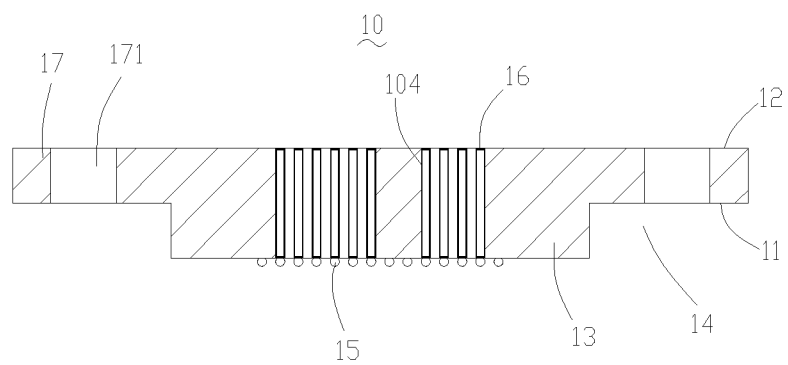
FIG. 4 is a cross section of FIG. 3 taken along line A-A.

Referring to FIGS. 3 and 4, the interposer 10 includes a bottom face 11 and an opposite top face 12. The interposer 10 forms a protrusion 13 at the bottom face 11 thereof. A space 14 is formed besides the protrusion 13. A plurality of first contacts 15 are formed at the bottom of the protrusion 13. The test circuit board 40 forms a plurality of pads 41 (as shown in FIG. 1) corresponding to the first contacts 15 of the protrusion 13, respectively. The first contacts 15 at the bottom of the protrusion 13 are used for soldering with corresponding pads 41 of the test circuit board 40, respectively, thereby soldering the interposer 10 onto the test circuit board 40. A plurality of second contacts 16 are formed on the top face 12 of the interposer 10. The second contacts 16 are electrically connected to the first contacts 15, respectively.

Figure 5:
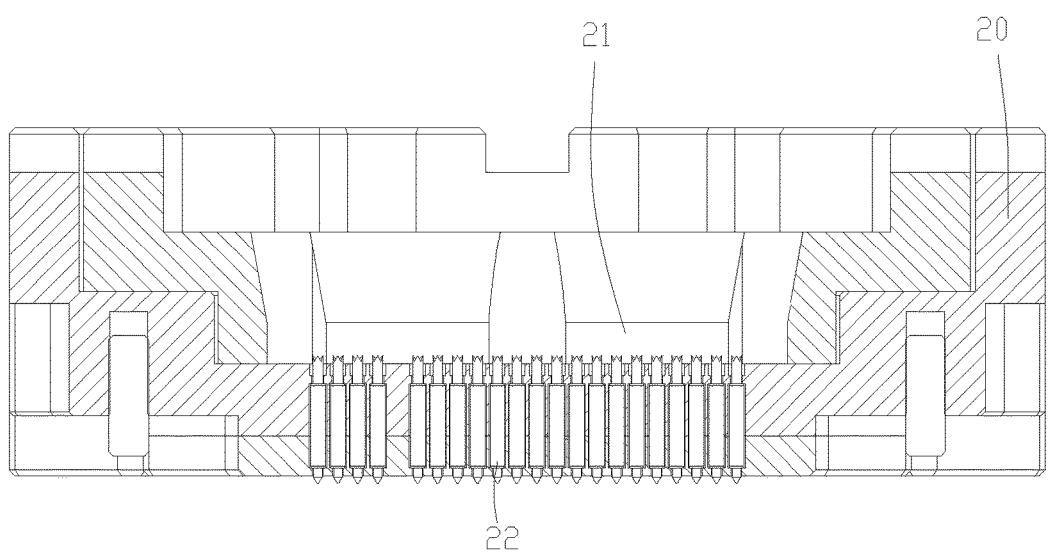
FIG. 5 is a cross section of a test socket of the test fixture of FIG. 2, along with conductors.
Figure 6:
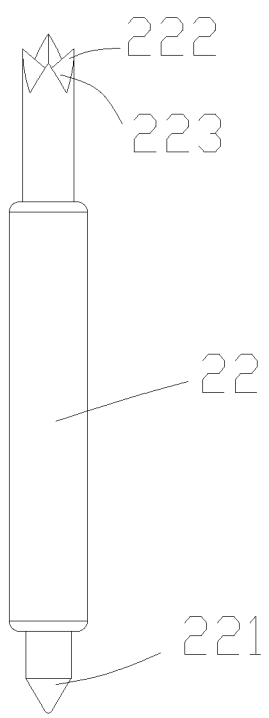
FIG. 6 is a schematic, enlarged view of the conductor of FIG. 5.
Figure 7:
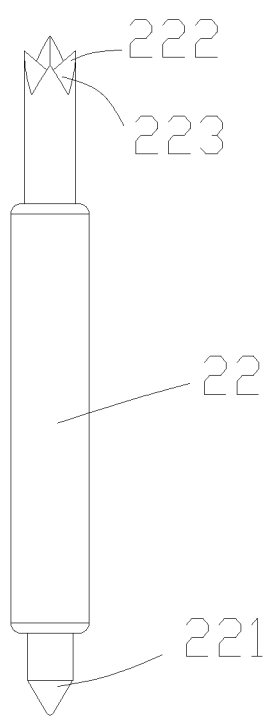
FIG. 7 is a bottom view of the IC to be tested shown in FIG. 1

Referring to FIG. 1, FIG. 5 and FIG. 6, the test socket 20 defines a guide groove 21 in a middle of a top thereof, for receiving the IC to be tested 50. The IC 50 includes a plurality of pins 51 at a bottom thereof (as shown in FIG. 7), corresponding to the pads 41 of the test circuit board 40, respectively. A plurality of conductors 22 are arranged at a position corresponding to the guide groove 21 of the test socket 20. The conductors 22 extend through top and bottom sides of the test socket 20. When the test socket 20 is mounted on the interposer 10, a bottom of each conductor 22 is connected to one corresponding second contact 16 at the top face 12 of the interposer 10; a top of each conductors 22 is for contacting one corresponding pin 51 of the IC 50, thereby electrically connecting corresponding pins 51 of the IC 50 and the pads 41 of the test circuit board 40.

Referring to FIG. 1, the fastener 30 is mounted on the test socket 20 for pressing the IC 50 when assembled.

The above test fixture 102, which forms the protrusion 13 at the bottom face 11 of the interposer 10 and space 14 besides the protrusion 13, makes the size of the protrusion 13 can be designed generally the same with that of the IC to be tested 50. Thus, the space 14 besides the protrusion 13 avoids interference of the interposer 10 with electrical elements around a mounting position of the test circuit board 40 for the IC 50, which facilitates soldering the interposer 10 onto the test circuit board 40 and improves reliability of the test. Compared to related test fixture in the art, making test circuit board 40 for each test fixture 102 is not needed, greatly shorten the time and reducing the cost for producing the test device 100. In addition, the conductors 22 are connected to the test circuit board 40 indirectly, avoiding puncturing the pads 41 of the test circuit board 40, and accordingly improving reliability of the test and lifespan of the test device 100.

Referring to FIGS. 1 and 4, in this embodiment, the space 14 is two in number. The two spaces 14 are at opposite sides of the protrusion 13. The interposer 10 forms two symmetric mounting portions 17 corresponding to the two spaces 14. Each mounting portion 17 defines at least one first mounting hole 171 therein. The test socket 20 defines a second mounting hole 23 corresponding to each first mounting hole 171 of each mounting portion 17. The test fixture 102 further includes a plurality of locking members 60, which cooperate with corresponding first and second mounting holes 23 to fix the interposer 10 and test socket 20 together. In this embodiment, the locking members 60 are screws, the first mounting holes 171 are screw holes, and the second mounting holes 23 are through holes. The screws extend upwards through the second mounting holes 23 and then screwed in the first mounting holes 171, thereby fixedly connecting the interposer 10 and test socket 20 together.

The number and position of the spaces 14 are not limited to be the same as that shown in the first embodiment. The spaces 14 can be four in number and surround the protrusion 13 in other embodiments.

A plurality of conducting poles 104 are arranged in the interposer 10, corresponding to the pins 51 of the IC 50 to be tested, respectively. Each first contact 15 is electrically connected to the corresponding second contact 16 via one conducting pole 104. In this embodiment, the interposer 10 is a printed circuit board. The first contacts 15, second contacts 16, and conducting poles 104 are formed through printed circuit board manufacture.

Referring to FIGS. 5 and 6, in this embodiment, the conductors 22 are probes. Each probe forms an electrode 221 at a bottom thereof, for electrically connecting one corresponding second contact 16 of the interposer 10. Each conductor 22 forms a plurality of bumps 222 at a top thereof. The bumps 222 are evenly spaced from each other along a circumferential direction. A cutout 223 is defined between each two neighboring bumps 222. When the IC to be tested 50 is mounted in the guide groove 21 of the test socket 20 and pressed tightly, the bumps 222 of each conductor 22 are electrically connected to one corresponding pin 51 of the test circuit board 40. The design of several spaced bumps 222 improves reliability of electric connection between the conductors 22 and the pins 51 of the IC 50, thereby improving stability of the electric property testing of the present test device 100.

In this embodiment, the bumps 222 and cutouts 223 both are four in number. The four cutouts 223 communicate with each other, and are cross in whole. It should be understood that the bumps 222 and cutouts 223 can be more or less, not limited to be four. For example, the bumps 222 and cutouts 223 can be three or five. In addition, the top of the conductor 22 can be other profile, such as spheroid, taper, and etc.

In this embodiment, the conductors 22 are probes. Accordingly, the conductors 22 can be conductive adhesive in other embodiments, not limited to be probes.

Figure 8:
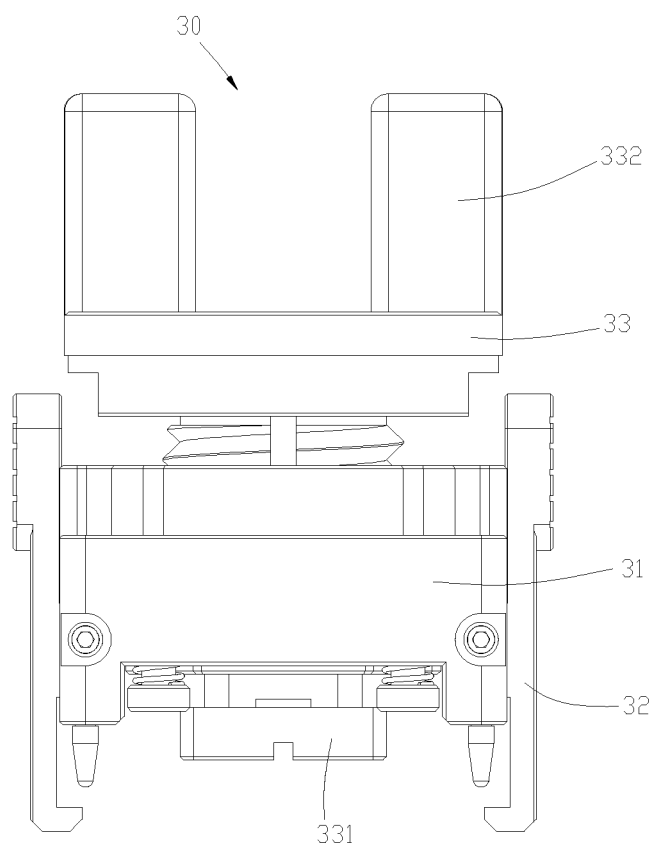
FIG. 8 is a side view of a fastener of the test fixture of FIG. 2.

Referring to FIGS. 1 and 8, the fastener 30 includes a frame 31, two clips 32 and a rotating pressing member 33. The two clips 32 are rotatably connected at two opposite sides of the frame 31, respectively. The pressing member 33 is rotatably connected onto the frame 31. A block 331 is formed at a bottom of the pressing member 33 for pressing the IC 50 to be tested. An operating portion 332 is formed at a top of the pressing member 33 for rotating the pressing member 33. The test socket 20 defines two locking slots 24 at two opposite sides thereof, corresponding to the two clips 32 (as shown in FIG. 1). The clips 32 engage in the locking slots 24 to fix the fastener 30 on the test socket 20.

Using the present test device 100 to test an electric property of an IC 50 includes steps as follows:
providing the above IC test device 100;
soldering the interposer 10 onto the test circuit board 40, ensuring that the first contacts 15 of the interposer 10 electrically connect to the pads 41 of the test circuit board 40, respectively;
fixing the test socket 20 to the interposer 10;
mounting the IC 50 into the guide groove 21 of the test socket 20;
assembling the fastener 30 to the test socket 20 to tightly press the IC 50; and
testing the electric property of the IC 50 through testing the test circuit board 40.

Figure 9:
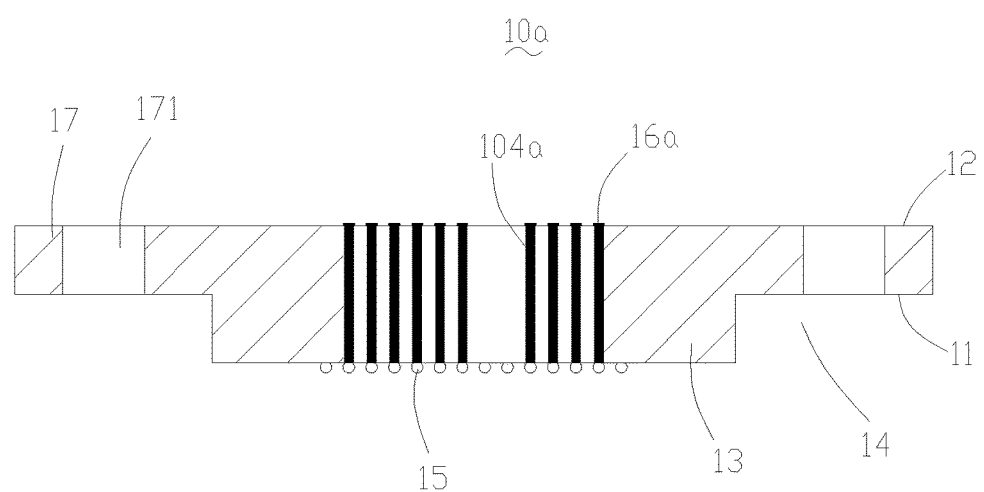
FIG. 9 is a cross section of the interposer according to an alternative embodiment.

In the above embodiment, the first contacts 15, second contacts 16 and conducting poles 104 of the interposer 10 are formed through printed circuit board manufacture. It should be understood that the construction of the interposer 10 can be in other form. FIG. 9 shows an alternative embodiment of the interposer 10*a* of the IC test fixture 102 of the present invention. In this embodiment, the construction of the interposer 10*a* is similar to that in the first embodiment. Elements of the interposer 10*a* having similar construction as that of the interposer 10 are labeled the same, and are not re-described. The difference is that: the interposer 10*a* of this embodiment is formed by implanting conducting poles 104*a* in an insulating board, the first contacts 15 are formed at the bottom ends of the conducting poles 104*a*, and the second contacts 16*a* are formed at the top ends of the conducting poles 104*a*.

Figure 10:
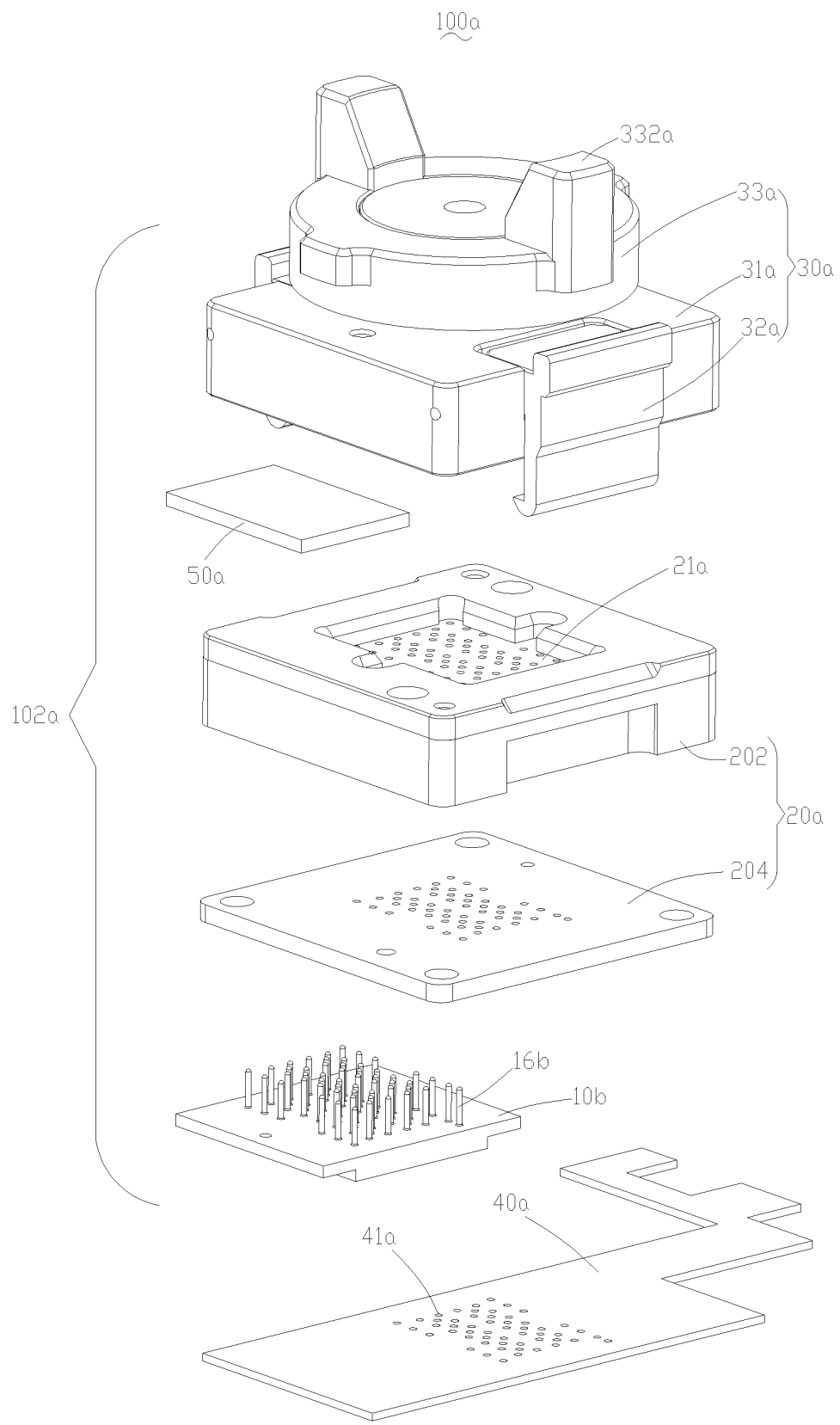
FIG. 10 is a schematic, exploded view of the test device according to a second embodiment of the present invention, along with the IC to be tested.
Figure 11:
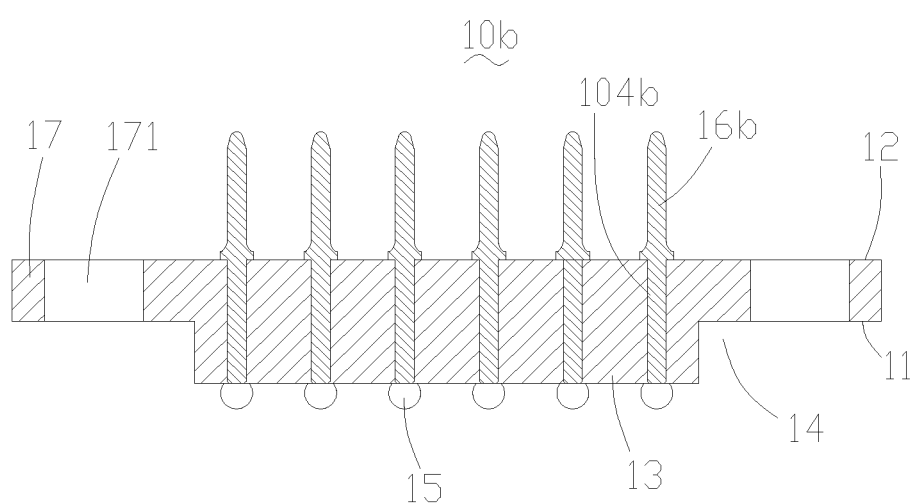
FIG. 11 is a cross section of the interposer of the test device of FIG. 10.
Figure 12:
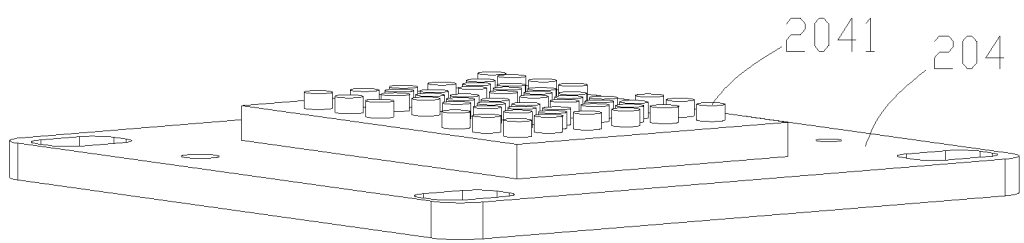
FIG. 12 shows a connector of the test device of FIG. 10 from another aspect.

Referring to FIGS. 10-12, a test device 100*a* according to a second embodiment of the present invention is shown. In this embodiment, the test device 100*a* includes a test fixture 102*a* and a test circuit board 40*a*. The test fixture 102*a* includes an interposer 10*b*, a test socket 20*a*, and a fastener 30*a*. The test fixture 102*a* is mounted on the test circuit board 40*a* for supporting an IC to be tested 50*a* thereon, thereby interconnecting the IC 50*a* and the test circuit board 40*a* electrically, and thus test electric property of the IC 50*a* through test the test circuit board 40*a*.

The interposer 10*b* of this embodiment is similar to the interposer 10 shown in FIGS. 3 and 4 in construction. Elements of the interposer 10*b* having similar construction as that of the interposer 10 are labeled the same, and are not re-described. The difference is that: the interposer 10*b* of this embodiment is formed by implanting conducting poles 104*b* in an insulating board, the first contacts 15 are formed at the bottom ends of the conducting poles 104*b*, and the second contacts 16*b* are poles connected to the top of the conducting poles 104*b*.

Correspondingly, the test circuit board 40*a* forms a plurality of pads 41*a* corresponding to the first contacts 15. The first contacts 15 at the bottom of the protrusion 13 of the interposer 10*b* are used for soldering with the corresponding pads 41*a* of the test circuit board 40*a*, thereby soldering the interposer 10*b* onto the test circuit board 40*a*.

The test socket 20*a* includes a seat body 202 and a connector 204 fixed to the bottom of the seat body 202. A plurality of terminals 2041 are formed at the bottom of the connector 204. A plurality of third contacts 2042 are formed at the top of the connector 204, and are electrically connected to the terminals 2041, respectively. The connector 204 and interposer 10*b* are mechanically and electrically connected through inserting connection of the corresponding terminals 2041 and second contacts 16*b*.

The test socket 20*a* defines a guide groove 21*a* in a middle of the top thereof, for mounting the IC to be tested 50*a*. The IC to be tested 50*a* forms a plurality of pins (not shown in FIG. 10, and referring to the pins 51 of FIG. 7) at the bottom thereof, corresponding to the pads 41*a* of the test circuit board 40*a*. The test socket 20*a* has a plurality of conductors (not shown in FIG. 10, and referring to the conductors 22 of FIGS. 5 and 6) positioned corresponding to the guide groove 21*a* and extending therethrough. When the test socket 20*a* (including the seat body 202 and connector 204) is mounted on the interposer 10*b*, a bottom end of each conductor is connected to one corresponding second contact 16*b* at the top face 12 of the interposer 10*b* through the connector 204; and a top end of each conductor is for contacting one corresponding pin 51 of the IC 50*a*, thereby electrically connecting the corresponding pins of the IC 50*a* and pads 41*a* of the test circuit board 40*a*.

The fastener 30*a* is mounted on the test socket 20*a* for pressing the IC to be tested 50*a*.

Compared to the test fixture 102 of the first embodiment, the test fixture 102*a* of this embodiment further has advantages of: mounting of the test fixture 102*a* is convenient since the test socket 20*a* and interposer 10*b* are connected electrically and mechanically by inserting.

The fastener 30*a* includes a frame 31*a*, two clips 32*a* and a rotating pressing member 33*a*. The two clips 32*a* are rotatably connected at two opposite sides of the frame 31a, respectively. The pressing member 33a is rotatably connected onto the frame 31a. A block (not sown in FIG. 10, and referring to the block 331 of FIG. 8) is formed at a bottom of the pressing member 33a for pressing the IC to be tested 50a. An operating portion 332a is formed at the top of the pressing member 33a. The test socket 20a defines two locking slots 24a at two opposites thereof, corresponding to the two clips 32a (as shown in FIG. 10b). The clips 32a engage in the locking slots 24a to fix the fastener 30a on the test socket 20a.

In this embodiment, an arrangement of the second contacts 16b on the top face 12 of the interposer 10b is the same as that of the pads 41a of the test circuit board 40a.

Using the test device 100a of this embodiment to test the IC 50a is the same as the test device 100a of the first embodiment, and is not re-described.

In this embodiment, the second contacts 10b of the interposer 10b are poles connected to the top ends of the conducting poles 104b, and the terminals 2041 of the connector 204 define inserting holes corresponding to the poles, thereby obtaining mechanical and electrical connection of the interposer 10b and connector 204 through inserting the second contacts 16b into the inserting holes of the terminals 2041 of the connector 204. Accordingly, a connection manner of the interposer 10b and connector 204 can be varied.

Figure 13:
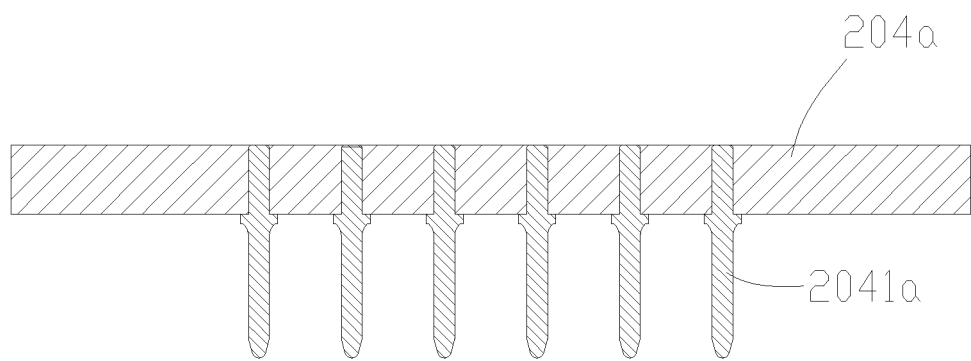
FIG. 13 is a cross section of the connector of a second embodiment.

FIG. 13 shows a cross section of a connector 204a according to a second embodiment. The connector 204a of this embodiment differs from the connector 204 in that: the terminals 2041 are solid poles.

Figure 14:
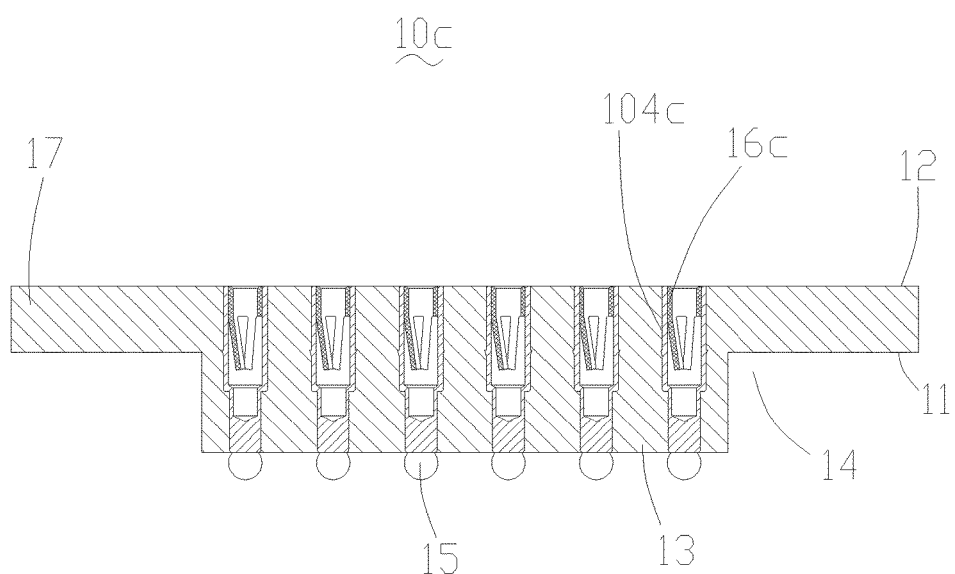
FIG. 14 is a cross section of the connector according to a third embodiment.

FIG. 14 is a cross sectional view of an interposer 10c according to a third embodiment. The interposer 10c is similar to that in the first embodiment. Elements of the interposer 10c having similar construction as that of the interposer 10 are labeled the same, and are not re-described. The difference is that: the interposer 10c of this embodiment is formed by implanting conducting poles 104c in an insulating board, the first contacts 15 are formed at the bottom ends of the conducting poles 104c, and the second contacts 16c are elastic claws formed in the conducting poles 104c. The interposer 10c of this embodiment cooperates with the connector 204a of FIG. 13, replacing the interposer 10b and connector 204 of FIG. 10.

Figure 15:
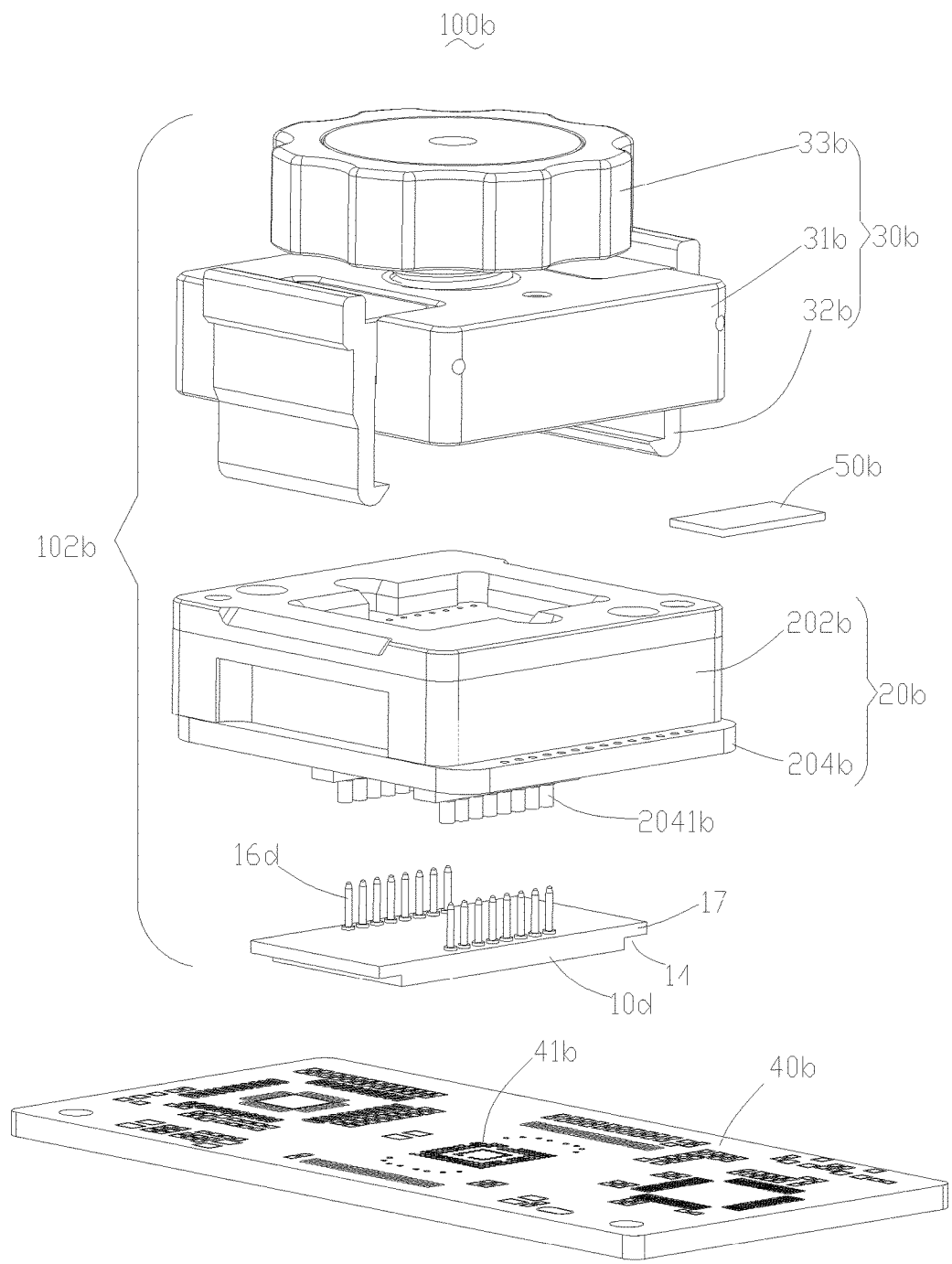
FIG. 15 is a schematic, exploded view of a test device according to a third embodiment of the present invention, along with the IC to be tested.

Referring to FIG. 15, a test device 100b in accordance with a third embodiment of the present invention is shown. In this embodiment, the test device 100b includes a test fixture 102b and a test circuit board 40b. The test fixture 102b includes an interposer 10d, a test socket 20b, and a fastener 30b. The test fixture 102b is mounted on the test circuit board 40b for supporting the IC 50b thereon, thereby interconnecting the IC 50b and the test circuit board 40b electrically, and thus testing electric property of the IC 50b through testing the test circuit board 40b.

The interposer 10d of this embodiment is similar to the interposer 10b of FIG. 11. Elements of the interposer 10d having similar construction as that of the interposer 10b of FIG. 11 are labeled the same, and are not re-described. The difference is that: an arrangement of the second contacts 16b on the top face of the interposer 10d is different from that of the pads 41b of the test circuit board 40b. In this embodiment, the second contacts 16d are in two lines and adjacent to two lateral sides of the interposer 10d.

The test socket 20b includes a seat body 202b and a connector 204b fixed to the bottom of the seat body 202b. The seat body 202b is similar to that shown in FIG. 10. Elements of the seat body 202b having similar construction as that of the seat body 202 of FIG. 10 are labeled the same, and are not re-described. The connector 204b and interposer 10d are connected mechanically and electrically through inserting.

The connector 204b is similar to that shown in FIG. 12, and differs only in that: an arrangement of the terminals 2041 of the connector 204b of this embodiment is the same as that of the second contacts 16d of the interposer 10d, i.e., the terminals 2041 are in two lines.

The fastener 30b includes a frame 31b, two clips 32b and a rotating pressing member 33b. The two clips 32b are rotatably connected at two opposite sides of the frame 31b, respectively. The pressing member 33b is rotatably connected onto the frame 31b. A block (not shown in FIG. 15, and referring to the block 331 of FIG. 8) is formed at a bottom of the pressing member 33b for pressing the IC 50b. The test fixture 102b of this embodiment has advantages similar to the test fixture 102a of the second embodiment.

Using the test device 100b of this embodiment to test the IC 50b is the same as the test device 100 of the first embodiment, and is not re-described.

Therefore, the embodiments described above are provided by way of examples only, and various other modifications will be apparent to persons skilled in the field without departing from the scope of the invention as defined herein.

The invention claimed is:

1. An IC test fixture, comprising:
   an interposer comprising a bottom face and an opposite top face, a protrusion being formed at the bottom face of the interposer, a space being formed besides the protrusion, a plurality of first contacts being formed at the bottom of the protrusion for soldering with corresponding pads of a test circuit board to solder the interposer onto the test circuit board, a plurality of second contacts being formed on the top face of the interposer and electrically connected to the first contacts, respectively;
   a test socket defining a guide groove in a middle of a top thereof for receiving an IC to be tested, a plurality of conductors being arranged at a position corresponding to the guide groove and extending through the test socket, a bottom end of each conductor being electrically connected to one corresponding second contact on the top face of the interposer and a top end of each conductor for contacting a pin of the IC to be tested when the test socket is mounted on the interposer; and
   a fastener being mounted on the test socket to press the IC to be tested;
   wherein the space is two in number and at opposite sides of the protrusion, and the interposer forms two mounting portions corresponding to the two spaces, each mounting portion defining at least one first mounting hole, the test socket defining a second mounting hole corresponding to each first mounting hole, locking members cooperating with corresponding first and second mounting holes to fix the interposer and test socket together.

2. The IC test fixture of claim 1, wherein the locking members are screws, the first mounting holes are screw holes, and the second mounting holes are through holes, the screws extending upwards through the second mounting holes and then screwed in the first mounting holes to fix the interposer and test socket together.

3. The IC test fixture of claim 2, wherein a plurality of conducting poles are arranged in the interposer corresponding to the pins of the IC to be tested, each first contact being electrically connected to the corresponding second contact via one conducting pole.

4. The IC test fixture of claim 3, wherein the first contacts, second contacts, and conducting poles of the interposer are formed through printed circuit board manufacture.

5. The IC test fixture of claim 3, wherein the interposer is formed by implanting conducting poles in an insulating board, the first contacts being formed at the bottom ends of the conducting poles, and the second contacts being formed at the top ends of the conducting poles.

6. The IC test fixture of claim 3, wherein the conductors are probes or conductive adhesive, each conductor forming an electrode at a bottom thereof for electrically connecting one corresponding second contact and forming a plurality of bumps at a top thereof, the bumps evenly spaced from each other along a circumferential direction, a cutout being defined between each two neighboring bumps, the bumps of each conductor being electrically connected to one corresponding pin of the IC when the IC to be tested is mounted in the guide groove of the test socket.

7. An IC test device, comprising:
a test circuit board comprising a plurality of pads; and
an IC test fixture comprising:
an interposer comprising a bottom face and an opposite top face, a protrusion being formed at the bottom face of the interposer, a space being formed besides the protrusion, a plurality of first contacts being formed at the bottom of the protrusion and soldered with corresponding pads of the test circuit board to solder the interposer onto the test circuit board, a plurality of second contacts being formed on the top face of the interposer and electrically connected to the first contacts, respectively;
a test socket defining a guide groove in a middle of a top thereof for receiving an IC to be tested, a plurality of conductors being arranged at a position corresponding to the guide groove and extending through the test socket, a bottom end of each conductor being electrically connected to one corresponding second contact on the top face of the interposer and a top end of each conductor for contacting a pin of the IC to be tested when the test socket is mounted on the interposer; and
a fastener being mounted on the test socket to press the IC to be tested;
wherein the space is two in number and at opposite sides of the protrusion, and the interposer forms two mounting portions corresponding to the two spaces, each mounting portion defining at least one first mounting hole, the test socket defining a second mounting hole corresponding to each first mounting hole, locking members cooperating with corresponding first and second mounting holes to fix the interposer and test socket together.

8. The IC test device of claim 7, wherein the locking members are screws, the first mounting holes are screw holes, and the second mounting holes are through holes, the screws extending upwards through the second mounting holes and then screwed in the first mounting holes to fix the interposer and test socket together.

9. The IC test device of claim 8, wherein a plurality of conducting poles are arranged in the interposer corresponding to the pins of the IC to be tested, each first contact being electrically connected to the corresponding second contact via one conducting pole, the first contacts, second contacts, and conducting poles of the interposer are formed through printed circuit board manufacture.

10. The IC test device of claim 8, wherein a plurality of conducting poles are arranged in the interposer corresponding to the pins of the IC to be tested, each first contact being electrically connected to the corresponding second contact via one conducting pole, the interposer is formed by implanting conducting poles in an insulating board, the first contacts being formed at the bottom ends of the conducting poles, and the second contacts being formed at the top ends of the conducting poles.

11. The IC test device of claim 9, wherein the conductors are probes or conductive adhesive, each conductor forming an electrode at a bottom thereof for electrically connecting one corresponding second contact and forming a plurality of bumps at a top thereof, the bumps evenly spaced from each other along a circumferential direction, a cutout being defined between each two neighboring bumps, the bumps of each conductor being electrically connected to one corresponding pin of the IC when the IC to be tested is mounted in the guide groove of the test socket.

* * * * *